(12) United States Patent
Guo et al.

(10) Patent No.: US 10,868,273 B2
(45) Date of Patent: Dec. 15, 2020

(54) DISPLAY PANEL AND DISPLAY DEVICES

(71) Applicant: Wuhan Tianma Micro-Electronics Co., Ltd., Wuhan (CN)

(72) Inventors: Linshan Guo, Wuhan (CN); Jun Yan, Wuhan (CN); Wenxin Jiang, Shanghai (CN); Xiao Li, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/456,106

(22) Filed: Jun. 28, 2019

(65) Prior Publication Data

US 2020/0251682 A1 Aug. 6, 2020

(30) Foreign Application Priority Data

Jan. 31, 2019 (CN) .......................... 2019 1 0099777

(51) Int. Cl.
| | |
|---|---|
| *G06F 3/044* | (2006.01) |
| *H01L 51/52* | (2006.01) |
| *H01L 27/32* | (2006.01) |
| *G06F 3/041* | (2006.01) |

(52) U.S. Cl.
CPC ........ *H01L 51/5253* (2013.01); *G06F 3/0412* (2013.01); *G06F 3/0443* (2019.05); *H01L 27/323* (2013.01); *H01L 27/3244* (2013.01); *G06F 2203/04112* (2013.01)

(58) Field of Classification Search
CPC ......... G06F 2203/04112; G06F 3/0412; G06F 3/0443; H01L 27/323; H01L 27/3244; H01L 51/5253
See application file for complete search history.

(56) References Cited

U.S. PATENT DOCUMENTS

| | | | | |
|---|---|---|---|---|
| 2002/0033917 A1* | 3/2002 | Hoshino | ........... | G02F 1/133553 349/113 |
| 2008/0252839 A1* | 10/2008 | Nakadaira | ........... | H01L 51/5253 349/153 |
| 2010/0051992 A1* | 3/2010 | Kobayashi | .......... | H01L 27/3283 257/98 |
| 2011/0042691 A1* | 2/2011 | Hayata | ................ | H01L 51/0005 257/88 |
| 2013/0026533 A1* | 1/2013 | Lee | ..................... | H01L 51/5256 257/100 |
| 2014/0146278 A1* | 5/2014 | Lee | ................... | G02F 1/133377 349/110 |

(Continued)

FOREIGN PATENT DOCUMENTS

CN 105449118 B 12/2017

*Primary Examiner* — Tony O Davis
(74) *Attorney, Agent, or Firm* — Anova Law Group PLLC

(57) ABSTRACT

Display panel and display device are provided. The display panel includes: a display region and a non-display region surrounding the display region. The display region includes a light-emitting layer above a substrate, and a thin-film encapsulation layer is on a side of the light-emitting layer away from the substrate; the thin-film encapsulation layer includes at least one organic layer extending to the non-display region; and in a direction perpendicular to a plane of the substrate, a height of the at least one organic layer at a corner of the display region is greater than a height of the at least one organic layer at a side of the display region.

20 Claims, 15 Drawing Sheets

(56) References Cited

U.S. PATENT DOCUMENTS

| | | | |
|---|---|---|---|
| 2016/0190503 A1* | 6/2016 | Chang | H01L 51/5256 257/40 |
| 2016/0306472 A1* | 10/2016 | Park | H01L 51/5256 |
| 2017/0005149 A1* | 1/2017 | Park | H01L 51/56 |
| 2017/0262109 A1* | 9/2017 | Choi | G06F 3/0412 |
| 2018/0190737 A1* | 7/2018 | Yang | H01L 27/3276 |
| 2018/0269261 A1* | 9/2018 | Park | G06F 3/0412 |
| 2020/0075700 A1* | 3/2020 | Cao | H01L 51/56 |

* cited by examiner

DISPLAY PANEL AND DISPLAY DEVICES

CROSS-REFERENCE TO RELATED APPLICATION

This application claims the priority of Chinese Patent Application No. 201910099777.0, filed on Jan. 31, 2019, the content of which is incorporated herein by reference in its entirety.

TECHNICAL FIELD

The present disclosure generally relates to the field of display technology and more particularly, relates to a display panel and a display device.

BACKGROUND

With the continuous development of display technology, the manufacturing technology of display panels has become increasingly developed. Currently, the displays mainly include liquid crystal displays (LCD), plasma displays and organic light-emitting diode (OLED) displays, etc. OLED displays have been used in various high-performance display fields due to advantages such as high brightness, low power consumption, wide viewing angle, high response speed, etc.

In the conventional OLED displays, internal light-emitting devices may be encapsulated by a thin-film encapsulation technology to protect the light-emitting devices, but the encapsulating material may have certain fluidity before solidification during the packaging process. Due to the fluidity influence, a subsequent film layer may be easily broken near a boundary of the encapsulation film layer after solidification during the packaging process, so the effect of the subsequent film layer may be difficult to meet expectations and the failure rate of the display devices may be high.

SUMMARY

One aspect of the present disclosure provides a display panel. The display panel includes: a display region and a non-display region surrounding the display region. The display region includes a light-emitting layer on a substrate, and a thin-film encapsulation layer is on a side of the light-emitting layer away from the substrate. The thin-film encapsulation layer includes at least one organic layer extending to the non-display region. In a direction perpendicular to a plane of the substrate, a height of the at least one organic layer at a corner of the display region is greater than a height of the at least one organic layer at a side of the display region.

Another aspect of the present disclosure provides a display device. The display device includes a display panel. The display panel includes: a display region and a non-display region surrounding the display region. The display region includes a light-emitting layer on a substrate, and a thin-film encapsulation layer is on a side of the light-emitting layer away from the substrate. The thin-film encapsulation layer includes at least one organic layer extending to the non-display region. In a direction perpendicular to a plane of the substrate, a height of the at least one organic layer at a corner of the display region is greater than a height of the at least one organic layer at a side of the display region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
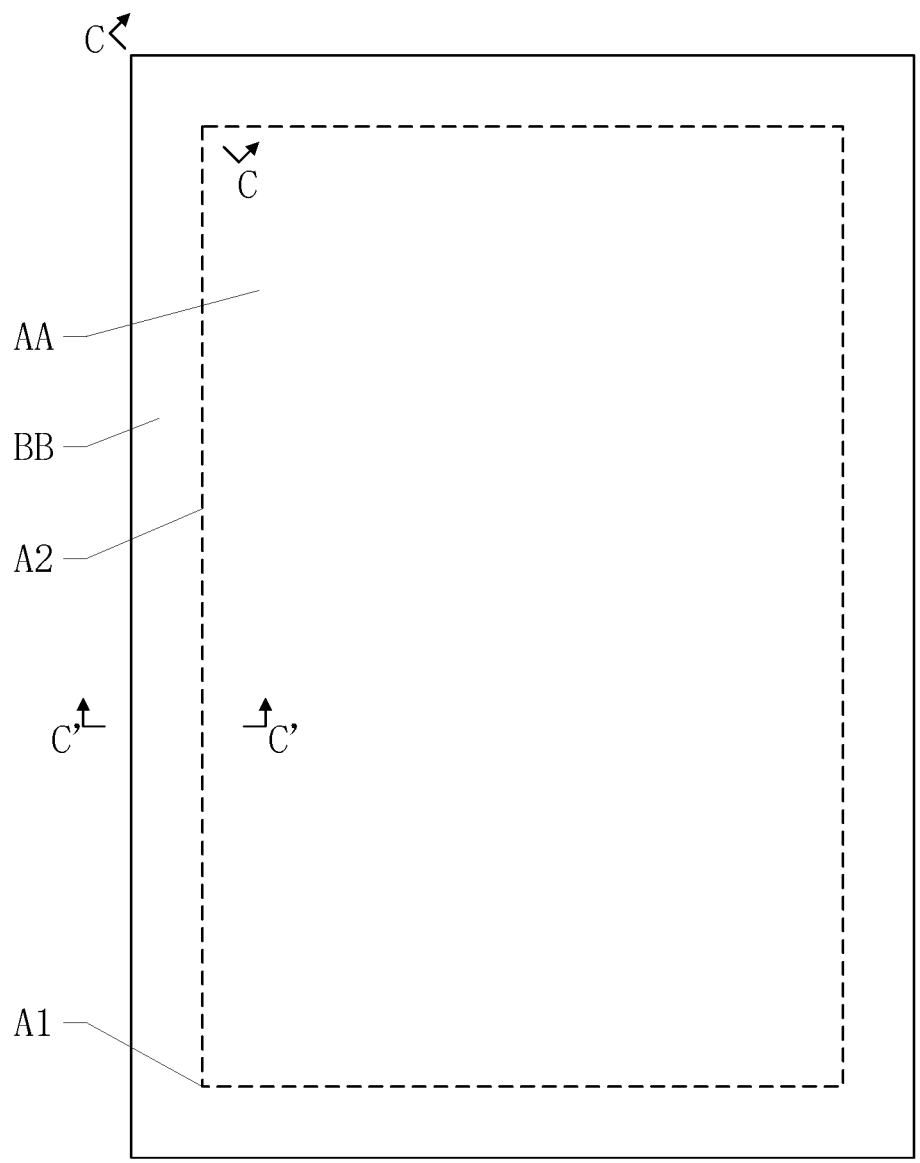
FIG. 1 illustrates a top-view structural schematic of an exemplary display panel according to embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

In organic light-emitting diode displays, internal light-emitting devices may be encapsulated by the thin-film encapsulation technology to protect the light-emitting devices, but the encapsulating material may have certain fluidity before solidification during the packaging process. Due to the fluidity influence, a height loss of the encapsulating material near the corner of the encapsulation film layer may be large. In a subsequent process, the functional film layer (e.g., a touch film layer for implementing touch function, etc.) may be easily broken near the corner of the encapsulation film layer, so the effect of the functional film layer may be difficult to meet expectations.

Figure 2:
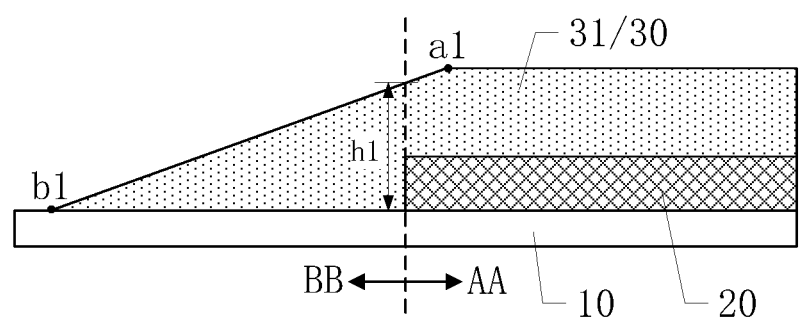
FIG. 2 illustrates a cross-sectional structural schematic along a C-C direction in FIG. 1.
Figure 3:
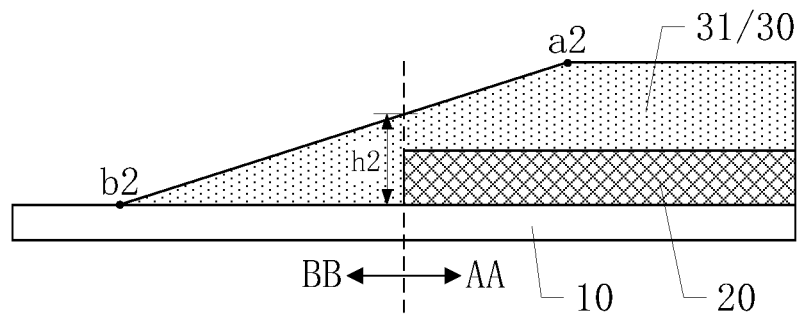
FIG. 3 illustrates a cross-sectional structural schematic along a C'-C' direction in FIG. 1.

The present disclosure provides an organic light-emitting diode display panel and a display device. Referring to FIG. 1, FIG. 2 and FIG. 3, FIG. 1 illustrates a top-view structural schematic of an exemplary display panel according to embodiments of the present disclosure; FIG. 2 illustrates a cross-sectional structural schematic along a C-C direction in FIG. 1; and FIG. 3 illustrates a cross-sectional structural schematic along a C'-C' direction in FIG. 1. A display panel provided by the present disclosure may include a display region AA and a non-display region BB disposed by surrounding the display region AA. The display region AA may include a light-emitting layer 20 disposed on a substrate 10, and a thin-film encapsulation layer 30 may be disposed on a side of the light-emitting layer 20 away from the substrate 10. The thin-film encapsulation layer 30 may include at least one organic layer 31 extending to the non-display region BB. In a direction perpendicular to a plane of the substrate 10, a height of the organic layer 31 at a corner A1 of the display region AA is h1 and a height of the organic layer 31 at a side A2 of the display region AA is h2, where h1>h2.

In one embodiment, the light-emitting layer 20 may be in the display region AA, so the display region AA may implement the function of displaying pictures through the light-emitting layer 20. The light-emitting layer 20 may be a multi-layer stacked structure. For example, the light-emitting layer 20 may include an anode layer, a cathode layer, and a light-emitting material between the anode layer and the cathode layer, etc., which may not be limited in various embodiments of the present disclosure. The non-display region BB disposed by surrounding the display region AA may not be used to display pictures, but the non-display region BB may be used to configure structures, such as lines, circuit boards, etc., for driving and/or detecting picture display.

The thin-film encapsulation layer 30 may be on a side of the light-emitting layer 20 away from the substrate 10, and the organic layer 31 of the thin-film encapsulation layer 30 may extend to the non-display region BB, that is, the thin-film encapsulation layer 30 may cover the light-emitting layer 20. Therefore, the light-emitting layer 20 may be isolated from the external environment, which may protect the film layer structure of the light-emitting layer 20 and extend the service life of the display panel. In addition, the thin-film encapsulation layer 30 may be advantageous to reduce the damage risk of the internal structure after the display panel is impacted. The substrate 10 may be a rigid substrate or a flexible substrate, which may not be limited in various embodiments of the present disclosure. The material of the rigid substrate may include, but not limited to, glass. The material of the flexible substrate may include, but be not limited to, one of polyimide (PI), polycarbonate (PC), polyethylene terephthalate (PET), and polymethyl methacrylate (PMMA).

The organic layer 31 may be formed by an inkjet printing technique. The organic material forming the organic layer 31 may include, but be not limited to, one of an epoxy-based organic material, a silicon-based organic material, and an acrylic-based organic material. The organic material may be printed on the corresponding film layer by the inkjet printing device and may have certain fluidity before solidification, so the organic material may diffuse horizontally and continuously. The printing number of the organic material may be set according to actual situations and the organic material may be solidified while printing, which may not be limited in various embodiments of the present disclosure.

The boundary of the display region AA may be adjusted according to actual situations, but the light-emitting layer 20 is ensured to be in the display region AA. The boundary of the display region AA may have a plurality of corners A1 and adjacent corners A1 may be connected by the side A2 to form a fixed space, so pictures may be displayed in the space.

In the direction perpendicular to the plane of the substrate 10, the height of the organic layer 31 at the corner A1 of the display region AA is h1 and the height of the organic layer 31 at the side A2 of the display region AA is h2, where h1>h2. A height loss of the organic material forming the organic layer 31 at the corner A1 may be smaller than a height loss of the organic material forming the organic layer 31 at the side A2, which may effectively prevent a subsequent film layer (especially a functional film layer) from being broken, disconnected, etc. in performing the subsequent film layer process. Therefore, the subsequent film layer may have the corresponding functions, which may be advantageous to improve the reliability and pass rate of the display panels.

Since the light-emitting layer 20 may have a certain height in the direction perpendicular to the plane of the substrate 10, the boundary of the organic material after solidification may be a slope shape when forming the organic layer 31, as shown in FIG. 2 and FIG. 3. The height h1 of the organic layer 31 at the corner A1 of the display region AA is greater than the height h2 of the organic layer 31 at the side A2 of the display region AA may be implemented by means of controlling process parameters of the inkjet printing technique, etc., which may reduce the manufacturing process difficulty and improve the production efficiency of the display devices. In this case, at the corner A1 of the display region AA, a starting point a1 of the slope shape may be in the display region AA, in the non-display region BB or at the corner A1, which may not be limited in various embodiments of the present disclosure. However, at the side A2 of the display region AA, a starting point a2 of the slope shape may be in the display region AA. Regardless of the positions of the starting points a1 and a2 of the slope shape, each of ending points b1 and b2 of the slope shape may be in the non-display region BB.

The slope of the slope shape may be set according to actual situations. The steeper the slope is and the steeper the slope shape is, the more advantageous is to reduce the space occupied by the organic layer 31 in the non-display region BB, so it may be easier to implement the narrow frame design of the display device, which may not be limited in various embodiments of the present disclosure.

It should be noted that, in order to more clearly illustrate the technical solution of the embodiments, other film layer structures may not be illustrated in FIGS. 1-3. In addition, the boundary of the display region AA may not be a visually existing boundary, but in order to more clearly illustrate the embodiments, the boundary of the display region AA may be illustrated by a dashed line in FIG. 1, and the boundary line of the light-emitting layer 20 may be illustrated by the dashed line as an example.

The display panel provided in one embodiment may have at least the following technical effects.

The organic material used for forming the organic layer may have certain fluidity before solidification. By setting the height of the organic layer in the thin-film encapsulation layer at the corner of the display region to be larger than the height at the side of the display region, the height loss, which is caused by the fluidity, of the organic material used for the organic layer at the corner of the display region may be effectively reduced. Therefore, the subsequent film layer may be effectively prevented from being broken, disconnected, etc. in the subsequent film layer process, and the use effect of the subsequent film layer may meet expectations, which may be advantageous to improve the pass rate and the production efficiency of the display devices.

Figure 4:
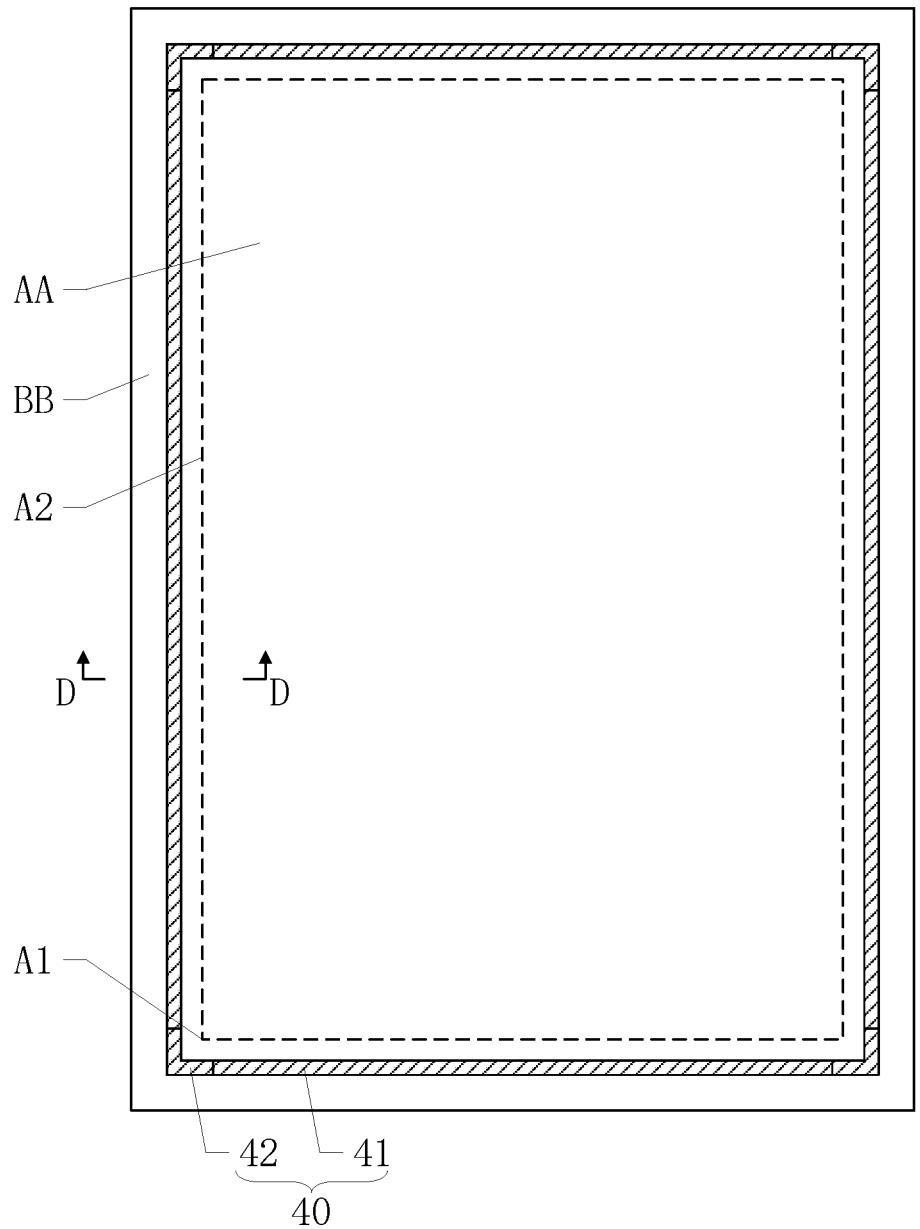
FIG. 4 illustrates a top-view structural schematic of another exemplary display panel according to embodiments of the present disclosure.
Figure 5:
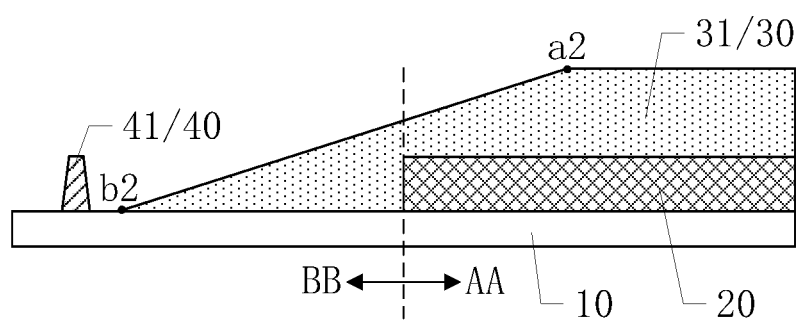
FIG. 5 illustrates a cross-sectional structural schematic along a D-D direction in FIG. 4.

In one embodiment of the present disclosure, referring to FIG. 4 and FIG. 5, FIG. 4 illustrates a top-view structural schematic of another exemplary display panel according to embodiments of the present disclosure; and FIG. 5 illustrates a cross-sectional structural schematic along a D-D direction in FIG. 4. The non-display region BB may include at least one blocking wall 40, which may be disposed by surrounding the organic layer 31. The blocking wall 40 may include a plurality of sidewalls 41, and two adjacent sidewalls 41 may be connected by a connecting part 42.

In one embodiment, the blocking wall 40 may be in the non-display region BB and may be disposed by surrounding the organic layer 31. The cross-sectional structure shown in FIG. 5 may be taken as an example. Since the boundary of the organic layer 31 is a slope shape, an ending point b2 of the slope shape may contact a side of the sidewall 41 adjacent to the organic layer 31, or may have a gap with the side of the sidewall 41 adjacent to the organic layer 31. In addition, the number of the blocking wall 40, the spacing between the sidewall 41 and the side A2, and the spacing between the connecting part 42 and the corner A1 may be set according to actual needs, which may not be limited in various embodiments of the present disclosure.

Since the blocking wall 41 is at a periphery of the organic layer 31, the height of the blocking wall 41 in the direction perpendicular to the plane of the substrate 10 may be set according to the stacking height of the subsequent film layer, which may be used to define the boundary of the subsequent film layer (e.g., other film layers for encapsulating the light-emitting layer 20, etc.). The material forming the blocking wall 40 may be an inorganic material such as silicon nitride, silicon oxide, silicon oxynitride, etc., and may be an organic material which is the same as or different from the organic layer 31. The sidewall 41 and the connecting part 42 may be separately formed or formed together, that is, the sidewall 41 and the connecting part 42 may be formed into a single piece of the blocking wall 40, which may not be limited in various embodiments of the present disclosure.

It should be noted that, in order to more clearly illustrate the technical solution of the embodiments, other film layer structures may not be illustrated in FIGS. 4-5.

Figure 6:
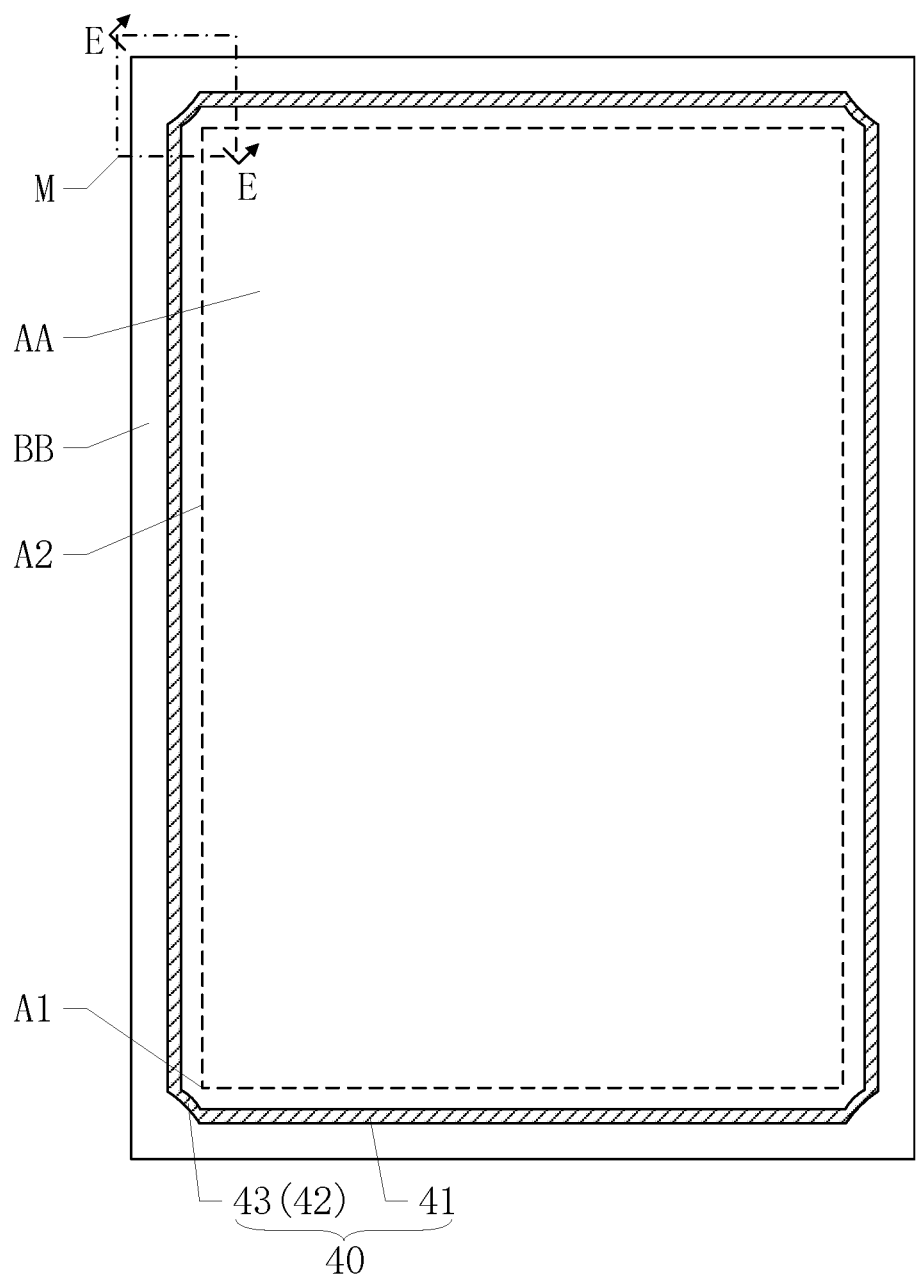
FIG. 6 illustrates a top-view structural schematic of another exemplary display panel according to embodiments of the present disclosure.
Figure 7:
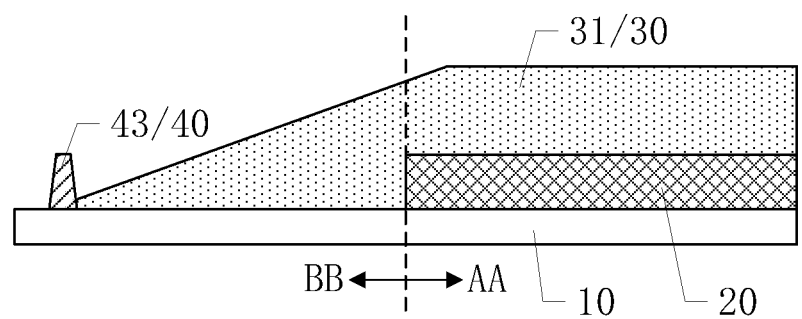
FIG. 7 illustrates a cross-sectional structural schematic along an E-E direction in FIG. 6.

In one embodiment of the present disclosure, referring to FIG. 6 and FIG. 7, FIG. 6 illustrates a top-view structural schematic of another exemplary display panel according to embodiments of the present disclosure; and FIG. 7 illustrates a cross-sectional structural schematic along an E-E direction in FIG. 6. At least one connecting part 42 may be a first connecting part 43 protruding toward the corner A1 of the display region AA, and a gap may disposed be between the first connecting part 43 and the corner A1 of the display region AA.

In one embodiment, the number of the first connecting part 43 on the blocking wall 40 may be set according to actual situations. For example, only one connecting part 42 may be set as the first connecting part 43, or a plurality of or even all of the connecting parts 42 may be set as the first connecting parts 43, which may not be limited in various embodiments of the present disclosure.

In order to enable the organic material used for the organic layer 31 to have better fluidity before solidification, a certain gap may be disposed between the first connecting part 43 and the corner A1. The protrusion of the first connecting part 43 toward the corner A1 of the display region AA may reduce the gap between the blocking wall 40 and the display region AA, so the height loss, which is caused by the fluidity, of the organic material used for the organic layer 31 at the corner A1 may be reduced, which may be advantageous to increase the height of the organic layer 31 at the corner A1 in the direction perpendicular to the plane of the substrate 10.

Furthermore, in a hollow trench formed by the protrusion of the first connecting part 43 toward the corner A1 of the display region AA, bent drivelines and detection lines of the display panel may be disposed, which may be advantageous to improve the space utilization of the non-display region BB and may be easier to implement the narrow frame design of the display device.

Figure 8:
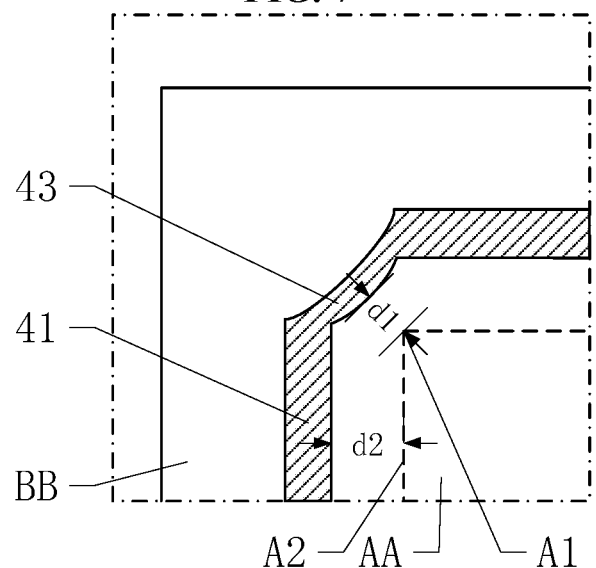
FIG. 8 illustrates an enlarged structural schematic of a region M in FIG. 6.
Figure 9:
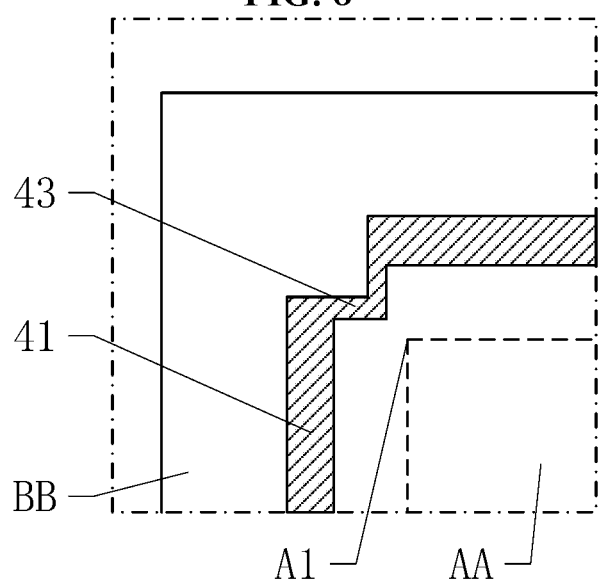
FIG. 9 illustrates another enlarged structural schematic of a region M in FIG. 6.

Referring to FIG. 8 and FIG. 9, FIG. 8 illustrates an enlarged structural schematic of a region M in FIG. 6; and FIG. 9 illustrates another enlarged structural schematic of a region M in FIG. 6. The protrusion of the first connecting part 43 may have various shapes, such as the arc shape shown in FIG. 8, the right-angle shape in FIG. 9, etc., which may not be limited in various embodiments of the present disclosure as long as the protrusion shape may reduce the space between the blocking wall 40 and the display region AA.

In one embodiment of the present disclosure, referring to FIG. 8, a minimum distance between the first connecting part 43 and the corner A1 of the display region AA is d1, and a minimum distance between the sidewall 41 and the side A2 of the display region AA is d2, where 0.5 d2≤d1≤1.5 d2. By appropriately setting the spacing between the sidewall 41 and the side A2, the spacing between the first connecting part 43 and the corner A1, the first connecting part 43 may be adapted to the manufacturing requirements of display panels with different screen-to-body ratios and may have wider applications.

It should be noted that, in order to more clearly illustrate the technical solution of the embodiments, other film layer structures may not be illustrated in FIGS. 6-9.

Figure 10:
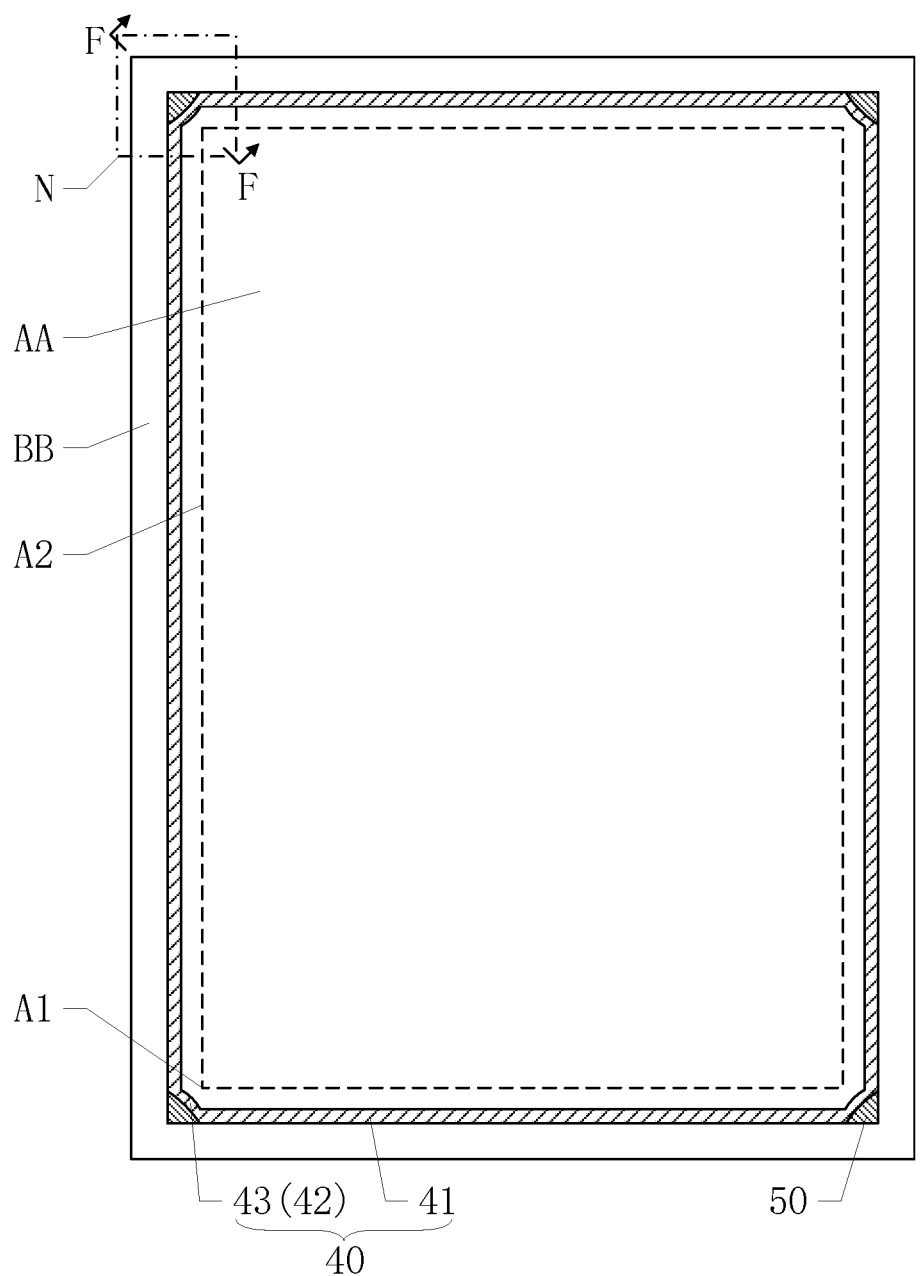
FIG. 10 illustrates a top-view structural schematic of another exemplary display panel according to embodiments of the present disclosure.

In one embodiment of the present disclosure, referring to FIG. 10, FIG. 10 illustrates a top-view structural schematic of another exemplary display panel according to embodiments of the present disclosure. The non-display region BB may include at least one filling portion 50 which may be on a side of the first connecting part 43 away from the display region AA.

In one embodiment, the filling portion 50 may be disposed on the side of the first connecting part 43 away from the display region AA, which may be advantageous to improve the mechanical strength of the blocking wall 40. For example, in the evaporation process, the filling portion 50 together with the blocking wall 40 may support the fine metal mask (FMM), which may reduce the pressure on the blocking wall 40 and prolong the service life of the blocking wall 40. In addition, the filling portion 50 may be in in the hollow trench formed by the protrusion of the first connecting part 43 toward the corner A1 of the display region AA, which may effectively prevent the filling portion 50 from affecting the line arrangement in the non-display region BB.

Figure 11:
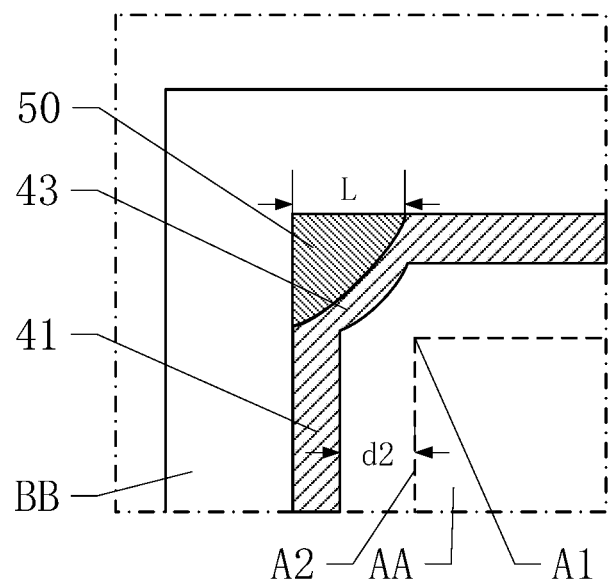
FIG. 11 illustrates an enlarged structural schematic of a region N in FIG. 10.

In one embodiment of the present disclosure, referring to FIG. 10 and FIG. 11, FIG. 11 illustrates an enlarged structural schematic of a region N in FIG. 10. The minimum distance between the sidewall 41 and the side A2 of the display region AA is d2, and a width of the filling portion 50 along the extending direction of the sidewall 41 is L, where L≤2 d2.

In one embodiment, each first connecting part 43 may be connected with the two sidewalls 41. The width of the filling portion 50 may be a width along the extending direction of any one of the sidewalls 41. The width of the filling portion 50 along the extending direction of one sidewall 41 may be the same as the width along the extending direction of another sidewall 41, and may be different from the width along the extending direction of another sidewall 41, which may not be limited in various embodiments of the present disclosure.

The width of the filling portion 50 may be set to be less than or equal to twice the minimum distance d2 between the sidewall 41 and the side A2 of the display region AA, which may effectively ensure the mechanical strength of the blocking wall 40.

Figure 12:
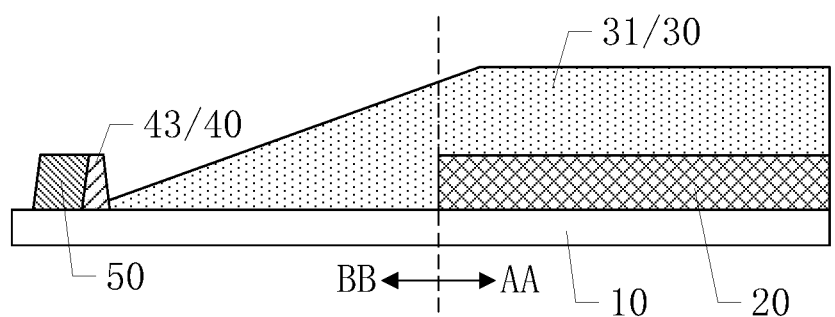
FIG. 12 illustrates a cross-sectional structural schematic along an F-F direction in FIG. 10.

In one embodiment of the present disclosure, referring to FIG. 10 and FIG. 12, FIG. 12 illustrates a cross-sectional structural schematic along a F-F direction in FIG. 10. In the direction perpendicular to the plane of the substrate 10, the height of the filling portion 50 may be larger than or equal to the height of the connecting part 42. On the one hand, the filling portion 50 may support the mask used for the subsequent film layer separately, or the filling portion 50 together with the blocking wall 40 may support the mask used for the subsequent film layer, which may reduce the pressure on the blocking wall 40 and prolong the service life of the blocking wall 40. On the other hand, the first connecting part 43 may protrude toward the corner A1, and the gap between the first connecting part 43 and the corner A1 may be small, so the organic material forming the organic layer 31 may flow faster when flowing through the gap. The height of the filling portion 50 may be set be larger than the height of the connecting part 42, which may effectively prevent the organic material from overflowing the first connecting part 43 due to inertia, and may be advantageous to improve the packaging effectiveness of the organic layer 31.

It should be noted that, in order to more clearly illustrate the technical solution of the embodiments, other film layer structures may not be illustrated in FIGS. 10-12. The shape and number of the filling portion 50 may be set according to actual situations, which may not be limited in various embodiments of the present disclosure. FIG. 10 may merely illustrate that one filling portion 50 may be disposed on the side of each first connecting part 43 away from the display region AA.

In one embodiment of the present disclosure, referring to FIG. 10 and FIG. 12, the filling portion 50 and the blocking wall 40 may be formed into a single piece, that is, the filling portion 50 and the blocking wall 40 may be patterned together using the same material, which may be advantageous to reduce the difficulty of the manufacturing process and improve the production efficiency of the display panel.

Figure 13:
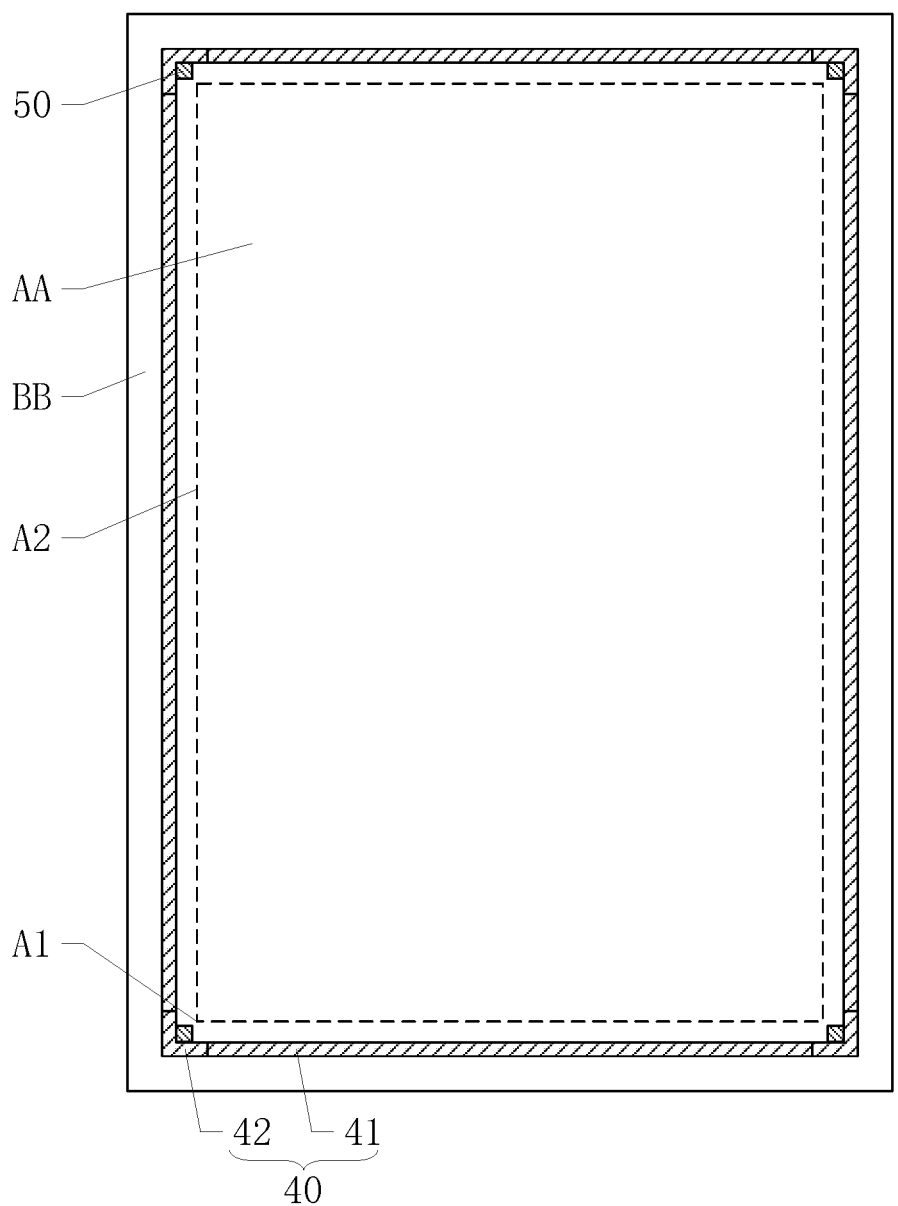
FIG. 13 illustrates a top-view structural schematic of another exemplary display panel according to embodiments of the present disclosure.

In the embodiments of the present disclosure, referring to FIG. 13, FIG. 13 illustrates a top-view structural schematic of another exemplary display panel according to embodiments of the present disclosure. The non-display region BB may include at least one filling portion 50 which is on the side of the connecting part 42 adjacent to the display region AA.

In one embodiment, in order to enable the organic material used for the organic layer 31 to have better fluidity before solidification, a certain gap may be disposed between the filling portion 50 and the corner A1. In such way, the filling portion 50 may reduce the gap between the blocking wall 40 and the display region AA, so the height loss, which is caused by the fluidity, of the organic material used for the organic layer 31 at the corner A1 may be reduced, which may be advantageous to increase the height of the organic layer 31 at the corner A1 in the direction perpendicular to the plane of the substrate 10.

It should be noted that, in order to more clearly illustrate the technical solution of the embodiments, other film layer structures may not be illustrated in FIG. 13. In addition, the width of the filling portion 50 along the extending direction of the sidewall 41 may be the same as the corresponding width of the filling portion 50 in above-mentioned embodiments, which may not be described in detail herein. The shape and number of the filling portion 50 may be set according to actual situations, which may not be limited in various embodiments of the present disclosure. FIG. 13 may merely illustrate that one filling portion 50 may be disposed on the side of each connecting part 42 adjacent to the display region AA.

Furthermore, the filling portion 50 and the blocking wall 40 may be formed into a single piece, that is, the filling portion 50 and the blocking wall 40 may be patterned together using the same material, which may be advantageous to reduce the difficulty of the manufacturing process and improve the production efficiency of the display panel.

Figure 14:
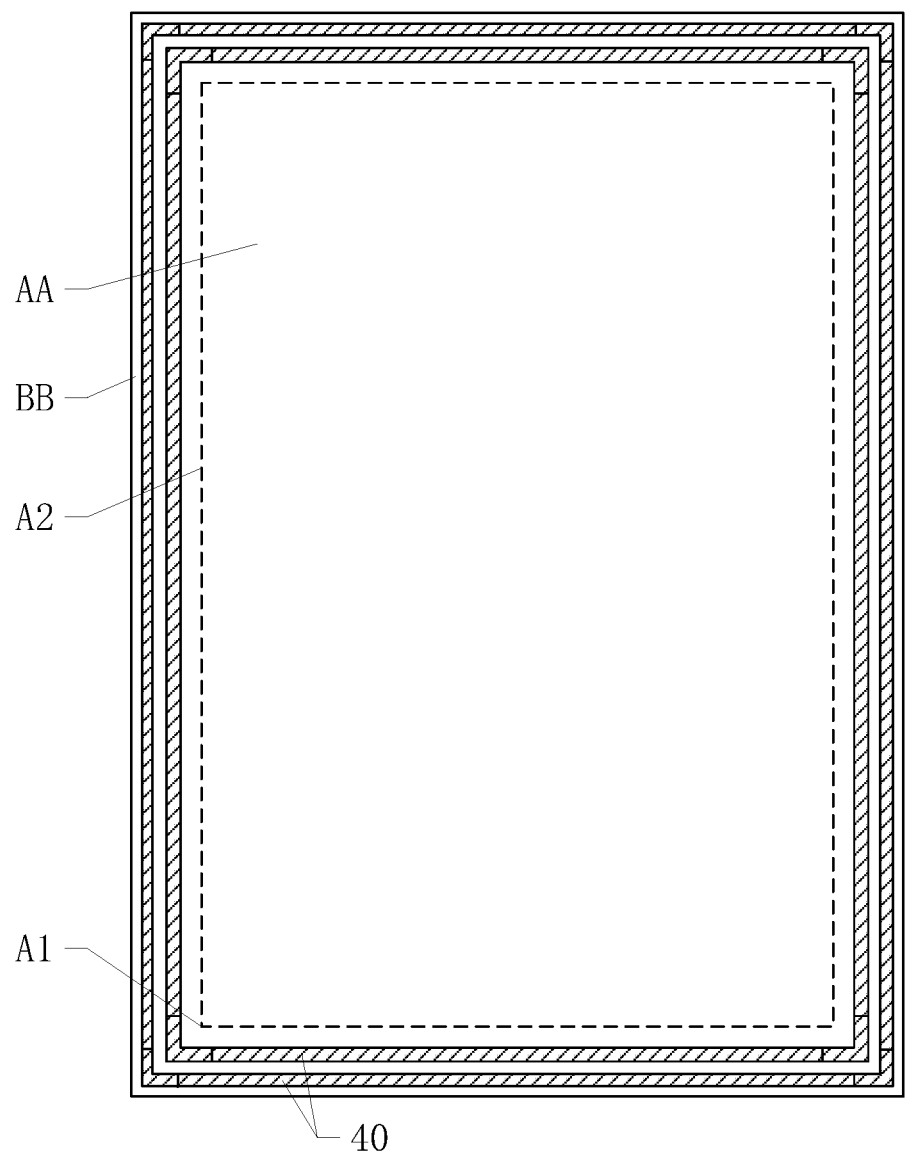
FIG. 14 illustrates a top-view structural schematic of another exemplary display panel according to embodiments of the present disclosure.
Figure 15:
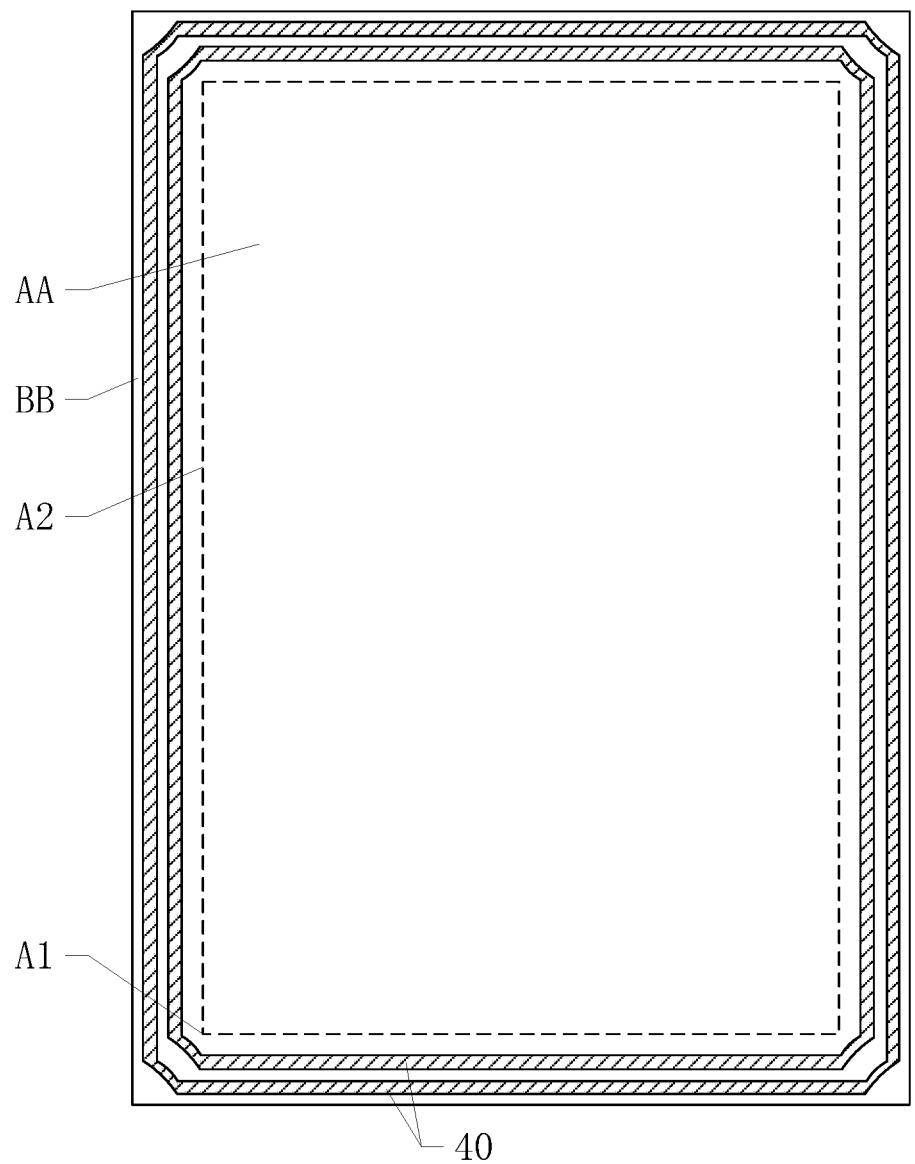
FIG. 15 illustrates a top-view structural schematic of another exemplary display panel according to embodiments of the present disclosure.

In the embodiments of the present disclosure, referring to FIG. 14 and FIG. 15, FIG. 14 illustrates a top-view structural schematic of another exemplary display panel according to embodiments of the present disclosure. FIG. 15 illustrates a top-view structural schematic of another exemplary display panel according to embodiments of the present disclosure. The non-display region BB may include two blocking walls 40, and one of the blocking walls 40 may be disposed by surrounding the other blocking wall 40.

In one embodiment, the two blocking walls 40 may be disposed by surrounding the display region AA sequentially, and a certain gap may be disposed between the two blocking walls 40. When the organic material forming the organic layer 31 overflows the inner blocking wall 40 during the flow process, the organic material may be blocked by the outer blocking wall 40, which may effectively prevent the flowing organic material from overflowing and ensure the organic layer 31 to have a better packaging effect on the light-emitting layer 20.

Meantime, in the subsequent film layer process, the two blocking walls 40 may also better define the boundary of the subsequent film layer. When the subsequent film layer is used as the encapsulation layer, the two inner and outer blocking walls 40 may be disposed to further improve the sealing property of the encapsulation layer on the light-emitting layer 20.

The shapes of the two blocking walls 40 may be shown in FIG. 14 or FIG. 15 and details may refer to the descriptions of FIG. 4 and FIG. 6. Of course, the shapes of the two blocking walls 40 may be one shape shown in FIG. 4 and the other shape shown in FIG. 6. Meanwhile, the materials of the two blocking walls 40 may be same or different, which may not be limited in various embodiments of the present disclosure.

Figure 16:
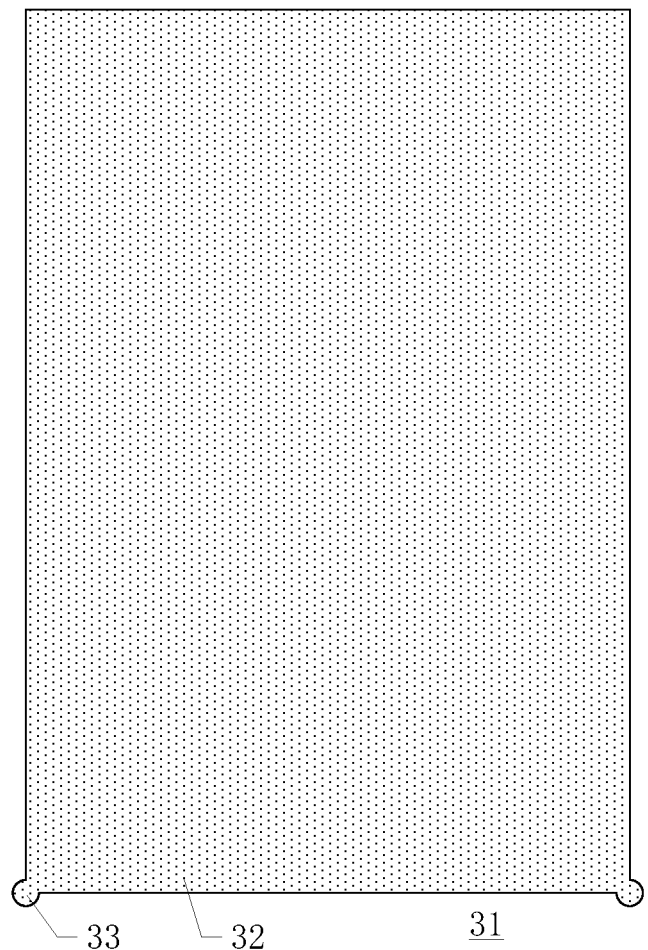
FIG. 16 illustrates a top-view structural schematic of an organic layer according to embodiments of the present disclosure.

In the embodiments of the present disclosure, referring to FIG. 1 and FIG. 16, FIG. 16 illustrates a top-view structural schematic of an organic layer according to embodiments of the present disclosure. The organic layer 31 may include a main portion 32 and at least one extension portion 33 which may be disposed at a corner of the main portion 32.

In one embodiment, the extension portion 33 may be disposed at at least one corner of the main portion 32 of the organic layer 31. The extension portion 33 may be formed in various ways. For example, the main portion 32 may be formed first using an inkjet printing device, then the printing amount of the organic material may be increased at the corner of the main portion 32 using the inkjet printing device, and the organic material may flow, diffuse and finally form the extension portion 33 after solidification. The organic materials of the main portion 32 and the extension portion 33 may be same or different, which may not be limited in various embodiments of the present disclosure.

Figure 17:
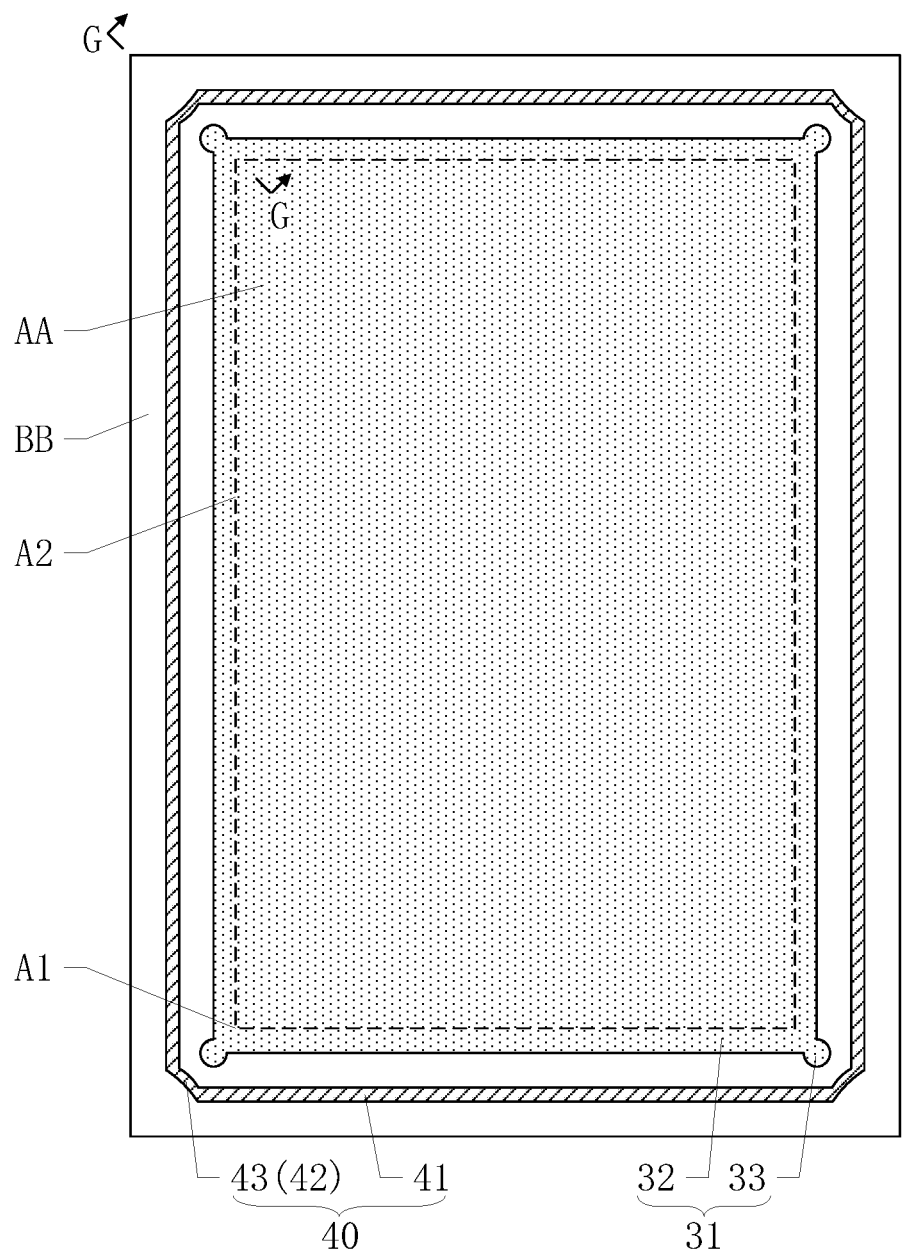
FIG. 17 illustrates a top-view structural schematic of another exemplary display panel according to embodiments of the present disclosure.
Figure 18:
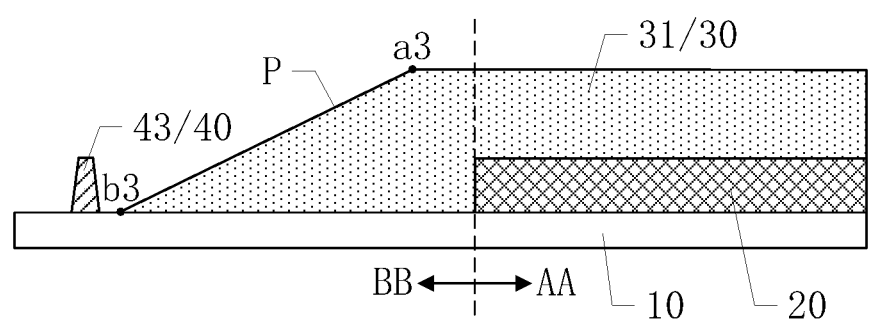
FIG. 18 illustrates a cross-sectional structural schematic along a G-G direction in FIG. 17.

In one embodiment of the present disclosure, referring to FIG. 17 and FIG. 18, FIG. 17 illustrates a top-view structural schematic of another exemplary display panel according to embodiments of the present disclosure; and FIG. 18 illustrates a cross-sectional structural schematic along a G-G direction in FIG. 17. The extension portion 33 may be disposed at each corner of the main portion 32. The corner of the organic layer 31 may be a first slope P which may be in the non-display region BB.

In one embodiment, the extension portion 33 formed by increasing the printing amount of the organic material may increase the height of the organic layer 31 at the corner A1 of the display region AA, so the first slope P may be in the non-display region BB, that is, both a starting point a3 and an ending point b3 of the first slope P may be in the non-display region BB. Therefore, the subsequent film layer (especially a functional film layer) may be effectively prevented from being broken, disconnected, etc. in the subsequent film layer process, and the subsequent film layer may have the corresponding functions, which may be advantageous to improve the reliability and pass rate of the display panels.

In one embodiment of the present disclosure, referring to FIG. 17 and FIG. 18, the non-display region BB may include at least one blocking wall 40 surrounding the organic layer 31. A gap may be disposed between the blocking wall 40 and the extension portion 33 of the organic layer 31, or the blocking wall 40 may contact the extension portion 33 of the organic layer 31.

In one embodiment, the shape and number of the blocking wall 40 may refer to the corresponding description in the above-mentioned embodiments and the details may not be described herein. Disposing the blocking wall 40 on the periphery of the organic layer 31 may be advantageous to define the boundary of the subsequent film layer, which may reduce the space occupied by the subsequent film layer in the non-display region BB and implement the narrow frame design of the display device. Furthermore, when a gap is disposed between the blocking wall 40 and the extension portion 33 of the organic layer 31, a gap may be also disposed between the main portion 32 of the organic layer 31 and the blocking wall 40.

Of course, when the screen-to-body requirement of the display panel is low, the boundary of the display region AA may be further reduced, and the slope shape of the organic layer 31 at the boundary may be in the non-display region BB, which may not be limited in various embodiments of the present disclosure.

It should be noted that, in order to more clearly illustrate the technical solution of the embodiments, other film layer structures may not be illustrated in FIGS. 17-18. Furthermore, the number of the extension portion 33 may be set according to actual situations, which may not be limited in various embodiments of the present disclosure. FIG. 17 may merely illustrate that the extension portion 33 may be disposed at each corner of the main portion 32.

Figure 19:
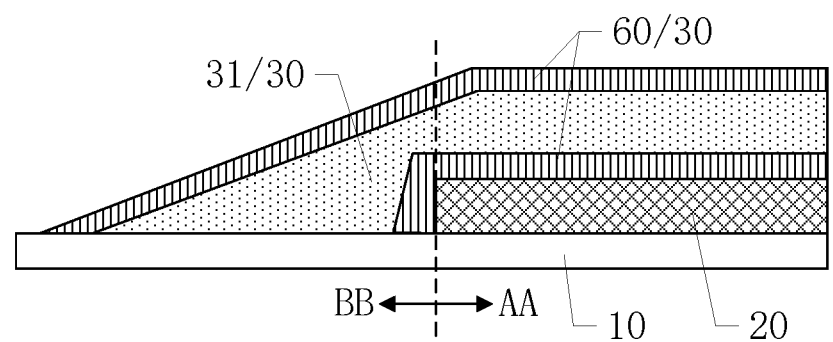
FIG. 19 illustrates another cross-sectional structural schematic along a C-C direction in FIG. 1.

In the embodiments of the present disclosure, referring to FIG. 1 and FIG. 19, FIG. 19 illustrates another cross-sectional structural schematic along a C-C direction in FIG. 1. The thin-film encapsulation layer 30 may include at least two inorganic layers 60 and the organic layer may be between two adjacent inorganic layers 60.

In one embodiment, the inorganic layer 60 may cover the light-emitting layer 20 as much as possible. The material of the inorganic layer 60 may include, but be not limited to, one of silicon oxide, silicon nitride, and silicon oxynitride. Molecules in the inorganic layer 60 may be arranged tightly and effectively block the external water vapor and oxygen, which may protect the film layer structure of the light-emitting layer 20 from moisture and oxygen, and prolong the service life of the display panel.

The organic layer 31 may be disposed between the adjacent two inorganic layers 60. On the one hand, the organic layer 31 may have a certain flatness, so the inorganic layer 60 covering the organic layer 31 may be less likely to be damaged. On the other hand, the organic layer 31 may extend the water oxygen erosion path between the adjacent two inorganic layers 60 and improve the sealing property of the thin-film encapsulation layer 30.

Figure 20:
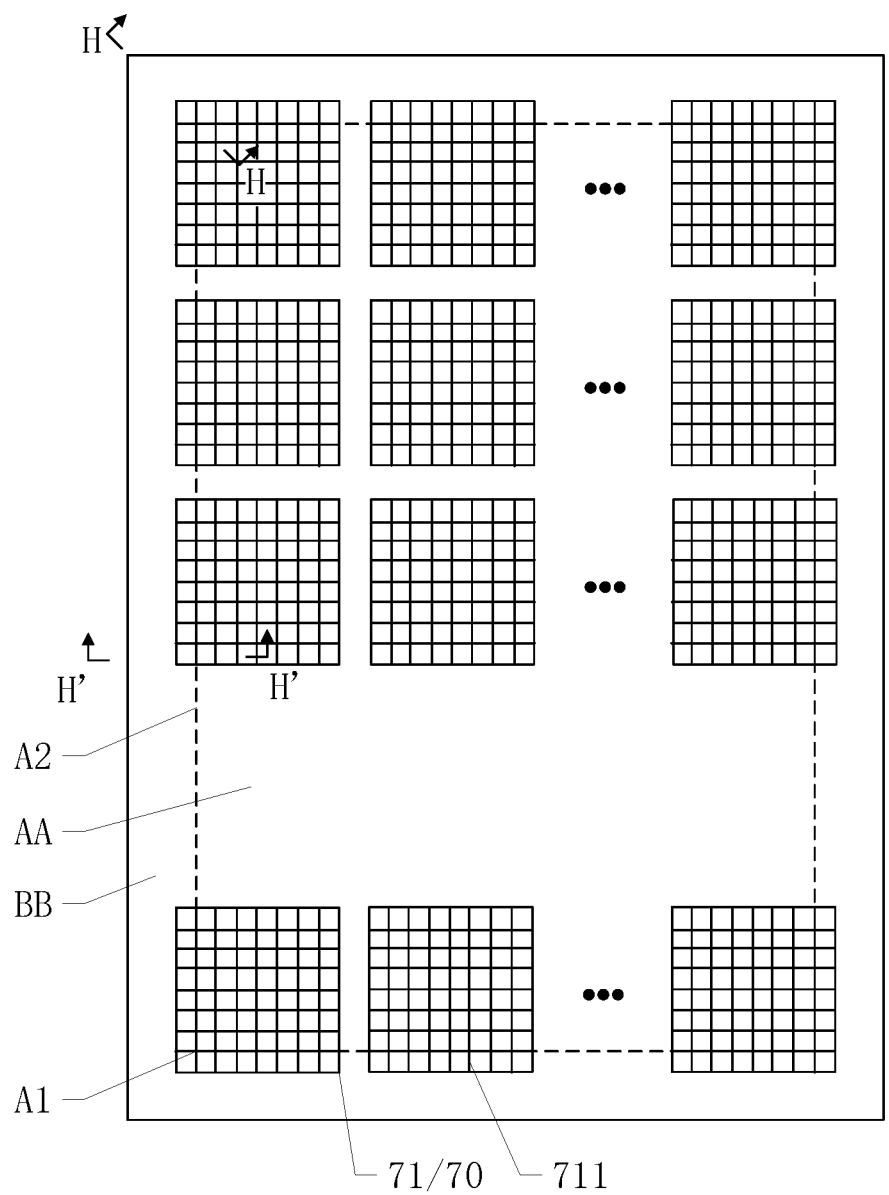
FIG. 20 illustrates a top-view structural schematic of another exemplary display panel according to embodiments of the present disclosure.

In the embodiments of the present disclosure, referring to FIG. 20, FIG. 20 illustrates a top-view structural schematic of another exemplary display panel according to embodiments of the present disclosure. A touch electrode layer 70 may be disposed on a side of the thin-film encapsulation layer 30 away from the substrate 10. The touch electrode layer 70 may extend to the non-display region BB and may include a plurality of touch electrodes 71 which may be meshed metal wires 711.

In one embodiment, by disposing the touch electrode layer 70, the display panel may have a touch function to meet various operational requirements of users. In addition, the touch electrode layer 70 may be on the side of the thin-film encapsulation layer 30 away from the substrate 10, that is, the touch electrode layer 70 may be fabricated after the display panel packaging is completed, so the touch electrode layer 70 may be effectively prevented from affecting the light-emitting layer 20 during the manufacturing process. Since the display region AA has the function of displaying pictures and the non-display region BB does not have the function of displaying pictures, by extending the touch electrode layer 70 to the non-display region BB, the problem of low touch sensitivity at the boundary of the display region AA (including the corner A1 and the side A2) in the conventional technology may be effectively solved, which may be advantageous to improve the recognition precision of the touch operation of the touch electrode layer 70.

The touch electrodes 71 may be meshed metal wires 711. The material, number, size of the meshed metal wires 711, and the spacing between the meshed metal wires 711 may be set according to actual needs, which may meet different touch precision requirements of the touch electrode layer 70. The boundary shape of the touch electrode 71 may be a rectangle, a diamond, a polygon, etc., which may not be limited in various embodiments of the present disclosure.

Figure 21:
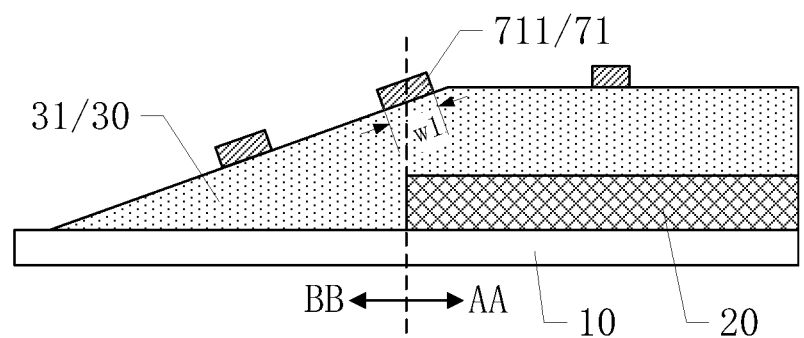
FIG. 21 illustrates another cross-sectional structural schematic along a H-H direction in FIG. 20.
Figure 22:
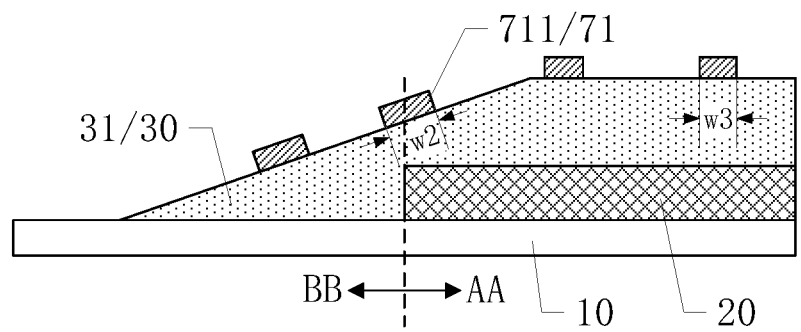
FIG. 22 illustrates another cross-sectional structural schematic along a H'-H' direction in FIG. 20.

In one embodiment of the present disclosure, referring to FIGS. 20-22, FIG. 21 illustrates another cross-sectional structural schematic along a H-H direction in FIG. 20; and FIG. 22 illustrates another cross-sectional structural schematic along a H'-H' direction in FIG. 20. A width of the metal wire 711 at the corner A1 of the display region AA is w1; a width of the metal wire 711 at the side A2 of the display region AA is w2; and a width of the metal wire 711 in the display region AA is w3, where w1≥w3 and w2≥w3.

Since the boundary of the organic material forming the organic layer 31 after solidification is a slope shape, when fabricating each touch electrode 71 of the touch electrode layer 70, the photoresist and the developer for patterning the metal wires 711 may be greatly consumed by the thin-film encapsulation layer 30 at the corners of the display region in the conventional technology; the impedance of the formed metal wires 711 may be relatively large; and even the metal wires 711 may be broken, which may be disadvantageous to improve the touch precision. However, in one embodiment, by setting the height of the organic layer 31 in the thin-film encapsulation layer 30 at the corner A1 of the display region AA to be larger than the height at the side A2 of the display region AA, the consumption of the photoresist and the developer at the corner A1 may be effectively reduced, which may prevent the metal wires 711 from being broken, ensure the impedance of the metal wires 711 not too large, and improve the touch precision.

A large portion of the metal wires 711 may be in the display region AA. Since the portion of the thin-film encapsulation layer 30 in the display region AA is relatively flat, the width w3 may be considered as a reference width of the metal wires 711. By setting the width w1 of the metal wires 711 at the corner A1 of the display region AA and the width w2 of the metal wires 711 at the side A2 of the display region AA to be greater than or equal to the reference width, it may be advantageous to reduce the impedance of the metal wires 711 and further improve the touch precision of the touch electrode layer 70 at the corner A1 and the side A2 of the display region AA. Meanwhile, the width of other metal wires 711 on the slope surface of the non-display region BB may be set to be larger than or equal to the reference width, so the entire touch electrode layer 70 may have high touch precision.

It should be noted that, in order to more clearly illustrate the technical solution of the embodiments, other film layer structures may not be illustrated in FIGS. 20-22. FIG. 20 may merely illustrate that the boundary shape of the touch electrode 71 may be rectangular.

The present disclosure also provides a display device, including the display panel provided by the present disclosure.

Figure 23:
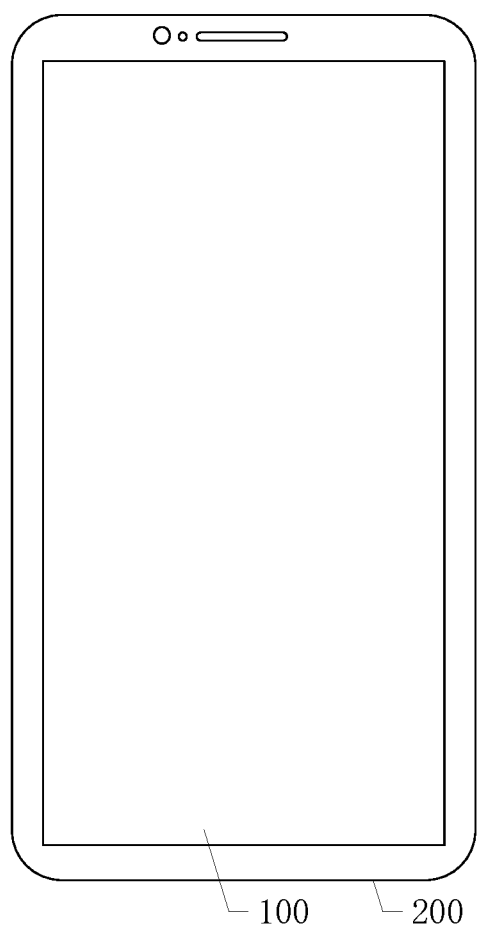
FIG. 23 illustrates a structural schematic of an exemplary display device according to embodiments of the present disclosure.

Referring to FIG. 23, FIG. 23 illustrates a structural schematic of an exemplary display device according to embodiments of the present disclosure. In one embodiment, a display device 200 may include the display panel 100 provided by any of the above-mentioned embodiments of the present disclosure. In FIG. 23, a mobile phone may only be used as an example for description of the display device 200. It should be understood that the display device 200 provided by the embodiments of the present disclosure may be a display device having a display function, such as a computer, a television, an in-vehicle display device, etc., which may not be limited according to various embodiments of the present disclosure. The display device provided by the embodiments of the present disclosure may have beneficial effects of the display panel provided by the embodiments of the present disclosure, and the details may refer to the detailed description of the display panel in the above-mentioned embodiments, which may not be described in one embodiment herein.

From the above-mentioned embodiments, it can be seen that the display panel and the display device provided by the present disclosure achieve at least the following beneficial effects.

The organic material used for forming the organic layer may have certain fluidity before solidification. By setting the height of the organic layer in the thin-film encapsulation layer at the corner of the display region to be larger than the height at the side of the display region, the height loss, which is caused by the fluidity, of the organic material used for the organic layer at the corner of the display region may be effectively reduced. Therefore, the subsequent film layer may be effectively prevented from being broken, disconnected, etc. in the process of the subsequent film layer, and the use effect of the subsequent film layer may meet expectations, which may be advantageous to improve the pass rate and the production efficiency of the display devices.

Of course, any of the products embodying the present disclosure does not necessarily need meet all of the technical effects described above at the same time.

The details of the present disclosure have been described through the embodiments provided above. However, those skilled in the art should understand that the disclosed embodiments are exemplary only and are not intended to limit the scope of the present disclosure. Those skilled in the art should understand that the disclosed embodiments can be modified according to the scope and principles of the present disclosure. The scope of the present disclosure is defined by the appended claims and their equivalents.

What is claimed is:

1. A display panel, comprising:
a display region and a non-display region surrounding the display region, wherein:
the display region includes a light-emitting layer above a substrate, and a thin-film encapsulation layer is on a side of the light-emitting layer away from the substrate;
the thin-film encapsulation layer includes at least one organic layer extending to the non-display region; and
in a direction perpendicular to a plane of the substrate, a height of the at least one organic layer at a corner of an interface between the display region and the non-display region is greater than a height of the at least one organic layer at a side of the interface between the display region and the non-display region.

2. The display panel according to claim 1, wherein:
the non-display region includes at least one blocking wall surrounding the at least one organic layer; and
the blocking wall includes a plurality of sidewalls and connecting parts each connecting two adjacent sidewalls of the plurality of sidewalls.

3. The display panel according to claim 2, wherein:
at least one of the connecting parts is a first connecting part which protrudes toward the corner of the display region, and
a gap is between the first connecting part and the corner of the display region.

4. The display panel according to claim 3, wherein:
a minimum distance between the first connecting part and the corner of the display region is d1, and
a minimum distance between a corresponding sidewall and a corresponding side of the display region is d2, wherein $0.5d2 \leq d1 \leq 1.5d2$.

5. The display panel according to claim 3, wherein:
the non-display region further includes at least one filling portion on a side of the first connecting part away from the display region.

6. The display panel according to claim 5, wherein:
a minimum distance between a sidewall and a side of the display region is d2; and
a width of the filling portion along an extending direction of the sidewall is L, wherein $L \leq 2d2$.

7. The display panel according to claim 5, wherein:
in the direction perpendicular to the plane of the substrate, a height of the filling portion is larger than or equal to a height of the connecting part.

8. The display panel according to claim 5, wherein:
the filling portion and the blocking wall are formed into a single piece.

9. The display panel according to claim 2, wherein:
the non-display region further includes at least one filling portion on a side of the connecting part adjacent to the display region.

10. The display panel according to claim 9, wherein:
a minimum distance between a sidewall and a side of the display region is d2; and
a width of the filling portion along an extending direction of the sidewall is L, wherein $L \leq 2d2$.

11. The display panel according to claim 9, wherein:
in the direction perpendicular to the plane of the substrate, a height of the filling portion is larger than or equal to a height of the connecting part.

12. The display panel according to claim 9, wherein:
the filling portion and the blocking wall are formed into a single piece.

13. The display panel according to claim 2, wherein:
the non-display region includes two blocking walls, and one of the blocking walls surrounds the other blocking walls.

14. The display panel according to claim 1, wherein:
the at least one organic layer includes a main portion and at least one extension portion; and
the at least one extension portion is at a corner of the main portion.

15. The display panel according to claim 1, wherein:
the thin-film encapsulation layer includes at least two inorganic layers, and the at least one organic layer is between two adjacent inorganic layers.

16. The display panel according to claim 1, wherein:
a touch electrode layer is on a side of the thin-film encapsulation layer away from the substrate and extends to the non-display region; and
the touch electrode layer includes a plurality of touch electrodes, each being formed by a plurality of meshed metal wires.

17. The display panel according to claim 16, further including:
a width of a metal wire of the plurality of meshed metal wires at the corner of the display region is w1; a width of a metal wire of the plurality of meshed metal wires at a side of the display region is w2; and a width of a metal wire of the plurality of meshed metal wires in the display region is w3, wherein $w1 \geq w3$ and $w2 \geq w3$.

18. A display panel, comprising:
a display region and a non-display region surrounding the display region, wherein:
the display region includes a light-emitting layer above a substrate, and a thin-film encapsulation layer is on a side of the light-emitting layer away from the substrate;
the thin-film encapsulation layer includes at least one organic layer extending to the non-display region;
in a direction perpendicular to a plane of the substrate, a height of the at least one organic layer at a corner of the display region is greater than a height of the at least one organic layer at a side of the display region;
the at least one organic layer includes a main portion and at least one extension portion;
the at least one extension portion is at a corner of the main portion;
the at least one organic layer includes a main portion and at least one extension portion;
the at least one extension portion is at a corner of the main portion;
the at least one extension portion is at each corner of the main portion; and
the at least one organic layer has a first slope at the corner, the first slope being in the non-display region.

19. A display device, comprising:
a display panel, comprising:
a display region and a non-display region surrounding the display region, wherein:
the display region includes a light-emitting layer on a substrate, and a thin-film encapsulation layer is on a side of the light-emitting layer away from the substrate;
the thin-film encapsulation layer includes at least one organic layer extending to the non-display region; and in a direction perpendicular to a plane of the substrate,
a height of the at least one organic layer at a corner of an interface between the display region and the non-display region is greater than a height of the at least one organic layer at a side of the interface between the display region and the non-display region.

20. The display device according to claim 19, wherein:

the at least one organic layer includes a main portion and at least one extension portion;

the at least one extension portion is at a corner of the main portion;

the at least one extension portion is at each corner of the main portion; and the at least one organic layer has a first slope at the corner, the first slope being in the non-display region.

* * * * *